US 6,594,120 B2

(12) United States Patent
Odagawa et al.

(10) Patent No.: US 6,594,120 B2
(45) Date of Patent: Jul. 15, 2003

(54) MAGNETORESISTIVE ELEMENT AND MAGNETIC MEMORY ELEMENT AND MAGNETIC HEAD USING THE SAME

(75) Inventors: Akihiro Odagawa, Nara (JP); Hideaki Adachi, Osaka (JP); Masayoshi Hiramoto, Nara (JP); Nozomu Matukawa, Nara (JP); Hiroshi Sakakima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 197 days.

(21) Appl. No.: 09/864,564

(22) Filed: May 23, 2001

(65) Prior Publication Data

US 2002/0030945 A1 Mar. 14, 2002

(30) Foreign Application Priority Data

May 24, 2000 (JP) ........................... 2000-152380

(51) Int. Cl.[7] ............ G11B 5/39; H01L 39/22; H01L 39/08
(52) U.S. Cl. ................. 360/313; 428/692; 428/900
(58) Field of Search ............. 360/313, 320, 360/322, 324, 324.1, 324.11, 324.2; 324/252; 338/32 R; 355/158, 178; 428/692, 693, 697, 701, 702, 900

(56) References Cited

U.S. PATENT DOCUMENTS

| 5,563,331 A | * | 10/1996 | Von Helmolt et al. ..... 73/31.05 |
| 5,792,569 A | * | 8/1998 | Sun et al. ............... 428/692 |
| 6,054,226 A | * | 4/2000 | Takeda et al. ............ 428/682 |

FOREIGN PATENT DOCUMENTS

| JP | 9-35926 | * | 2/1997 |
| JP | 2000-12920 | | 1/2000 |
| JP | 2000-12921 | | 1/2000 |

OTHER PUBLICATIONS

"Large magnetotunneling effect at low magnetic fields in micrometer–scale epitaxial . . . "; Yu Lu et al.; The American Physical Society, Sep. 1996.

"Giant magnetoresistance of manganese oxides with a layered perovskite structure"; Y. Morimoto et al.; Letters to Nature, Mar. 14, 1996.

Tokura "Correlation Electrons: Science Technology" *JSAP International* No. 2, Jul. 2000.

* cited by examiner

*Primary Examiner*—David L. Ometz
(74) *Attorney, Agent, or Firm*—Merchant & Gould P.C.

(57) ABSTRACT

The present invention provides a magnetoresistive element in which discontinuity at a barrier layer interface is provided by utilizing a layered-perovskite oxide, and a device in which the foregoing magnetoresistive element is used. The element of the present invention includes a layered-perovskite oxide having a composition expressed by a formula $L_2(A_{1-z}R_z)_2A_{n-1}M_nO_{3n+3+x}$ and including a $(L-O)_2$ layer in its crystalline structure, and a pair of ferromagnetic bodies formed in contact with the layer perovskite oxide so as to sandwich the oxide. In response to bias application via the $(L-O)_2$ layer, a magnetoresistive tunnel effect appears. In the foregoing formula, A represents at least one alkaline earth element selected from the group consisting of Ca, Sr, and Ba, L represents at least one element selected from the group consisting of Bi, Tl, and Pb, M represents at least one element selected from the group consisting of Ti, V, Cu, Ru, Ni, Mn, Co, Fe, and Cr, R represents a rare earth element, n is 1, 2, or 3, and x and z are numerical values satisfying $-1 \leq x \leq 1$, and $0 \leq z < 1$, respectively.

30 Claims, 11 Drawing Sheets

MAGNETORESISTIVE ELEMENT AND MAGNETIC MEMORY ELEMENT AND MAGNETIC HEAD USING THE SAME

BACKGROUND OF THE INVENTION

1. Field of the Invention

The present invention relates to a magnetoresistive element (magnetoresistance-effect element) providing a tunnel effect, which can be used as a component element of a magnetic device that is expected to have a high magnetic field sensitivity even for a low magnetic field, and also relates to a magnetic memory and a magnetic head, each of which uses the foregoing element.

2. Related Background Art

Magnetic sensors, memory elements, magnetic heads, etc. have been proposed as solid devices using magnetoresistive (MR) films. Studies so far made have proven that the MR effect a giant-magnetoresistive (GMR) film exhibits in response to a current flow perpendicular to a plane of the film (CPPMR) is greater than the MR effect the film exhibits in response to in-plane current flow (CIPMR). Further, a tunneling GMR (TMR) film with a high impedance can be expected to provide a further greater output.

Recently, a manganese (Mn) oxide having a perovskite structure has been reported as a material with a high magnetic polarizability (Y. Lu et al.: Phys. Rev. Lett. 54(1996) R8357).

To form a TMR film using such an oxide, compatibility between materials laminated is particularly significant. This is because characteristics of a TMR film depend considerably on a degree of discontinuity at a barrier layer interface. In the case where a complex oxide such as a perovskite Mn oxide is used, particularly, it is difficult to secure the discontinuity at the barrier layer interface.

SUMMARY OF THE INVENTION

Therefore, with the foregoing in mind, it is an object of the present invention to obtain excellent tunnel junction with use of the perovskite-type oxide, so as to provide a practical magnetoresistive element that exhibits a great magnetoresistance effect even in response to a low magnetic field. Further, it also is an object of the present invention to provide a device in which the foregoing element is used.

A magnetoresistive element of the present invention includes a layered-perovskite oxide (an oxide having a layered perovskite structure) having a composition expressed by a formula $L_2(A_{1-z}R_z)_2A_{n-1}M_nO_{3n+3+x}$ and including a $(L-O)_2$ layer in its crystalline structure, and a pair of ferromagnetic bodies formed in contact with the perovskite oxide layer so as to sandwich the oxide. In this element, a magnetoresistive tunnel effect appears in response to bias application via the $(L-O)_2$ layer.

Herein, A represents at least one alkaline earth element selected from the group consisting of calcium (Ca), strontium (Sr), and barium (Ba), L represents at least one element selected from the group consisting of bismuth (Bi), thallium (Tl), and lead (Pb), M represents at least one element selected from the group consisting of titanium (Ti), vanadium (V), copper (Cu), ruthenium (Ru), nickel (Ni), manganese (Mn), cobalt (Co), iron (Fe), and chromium (Cr), R represents a rare earth element (preferably at least one element selected from the group consisting of lanthanum (La), praseodymium (Pr), neodymium (Nd), and samarium (Sm)), n is 1, 2, or 3, and x and z are numerical values satisfying $-1 \leq x \leq 1$, and preferably $0 \leq z < 1$, respectively.

The above-described layered-perovskite oxide includes a $(L-O)_2$ barrier layer that per se includes a magnetoresistive tunnel junction array. In the present invention, a ferromagnetic body is further provided in contact with the foregoing oxide, so as to make the element more practical with view to application to various devices.

As will be described below, in one embodiment of the present invention, at least one of the ferromagnetic bodies is made of a perovskite oxide, and an oxide electrode is attached to this complex oxide ferromagnetic body. By so doing, excellent junction can be obtained as a whole. Further, in another embodiment of the present invention, one of the ferromagnetic bodies is made of a perovskite oxide, and the other is made of a metallic ferromagnetic material. Furthermore, in still another embodiment of the present invention, an antiferromagnetic body is provided in contact with one of the ferromagnetic bodies.

Thus, in the present invention, the foregoing layered-perovskite oxide is utilized, thereby allowing discontinuity to be obtained at the barrier layer interface. Further, a ferromagnetic body, an antiferromagnetic body, an oxide electrode, etc., compatible with the foregoing oxide are arranged additionally as required. By so doing, it is possible to provide a highly sensitive magnetoresistive element that is applied suitably in various devices (for instance, a magnetic head and a magnetic memory element).

DETAILED DESCRIPTION OF THE INVENTION

Figure 1A:
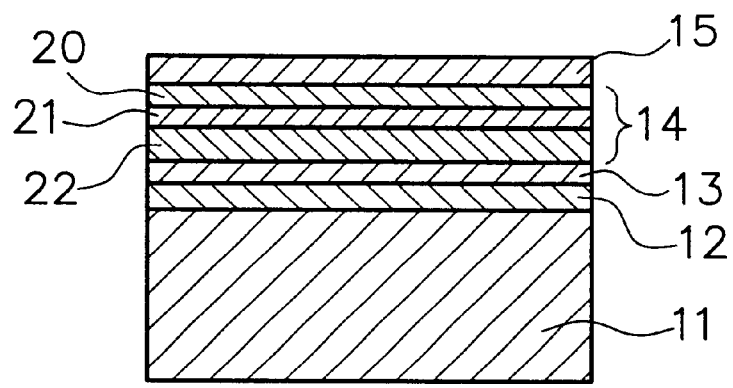
FIGS. 1A to 1A are cross-sectional views illustrating an example of a manufacturing process of a magnetoresistive element of the present invention.

The following description will depict a preferred embodiment of the present invention.

It is desirable that a ferromagnetic body obtains good contact with a layered perovskite structure oxide in the film thickness direction, and has an excellent conductivity. Besides, materials thereof desirably have good compatibility and are easily manufactured. Therefore, at least one of the ferromagnetic bodies desirably is made of a perovskite oxide, and more specifically, a complex oxide expressed by the formula:

$$((R_{1-p}L_p)_{1-y}A_y)_m MO_{m+2-d}$$

where: A, R, M, and L represent the aforementioned elements, respectively; n represents 1 or 2; and d, p, and y represent numerical values satisfying $0 \leq d \leq 1$, $0 \leq p \leq 1$, and $0 \leq y \leq 1$, respectively.

This perovskite oxide ferromagnetic body exhibits improved compatibility with a layered-perovskite oxide at their junction interface when it is formed in contact with at least either an upper surface or a lower surface, or both, of the layered-perovskite oxide. In the case where either one of the ferromagnetic bodies is to be made of a perovskite oxide, the ferromagnetic body on the lower side (substrate side) preferably is selected so as to be made of a perovskite oxide.

One preferable example of a combination of ferromagnetic bodes is a combination of a ferromagnetic body made of a perovskite oxide and a metallic ferromagnetic body. This pair is inferior in compatibility at the junction interface as compared with the case where both the ferromagnetic bodies are made of perovskite complex oxides, respectively. However, various excellent soft magnetic materials are available to form the metallic ferromagnetic body, and magnetic materials can be selected from a variety of soft and hard magnetic materials according to characteristics required of the element, thereby facilitating the control of the characteristics.

In a preferred embodiment of the present invention, a multilayer film formed on a substrate includes the aforementioned layered-perovskite oxide, and a pair of ferromagnetic bodies formed in contact with the layered-perovskite oxide so as to sandwich the layered-perovskite oxide, wherein, among the pair of the ferromagnetic bodies, the ferromagnetic body on the substrate side is made of a perovskite oxide, while the other ferromagnetic body (ferromagnetic body on a side opposite to the substrate) is made of a metallic ferromagnetic material.

The pair of ferromagnetic bodies may be provided so that they have different coercive forces, and that they have different thicknesses. Further, an antiferromagnetic body may be provided so as to be in contact with either one of the ferromagnetic bodies. When an antiferromagnetic body is provided in contact with a perovskite oxide ferromagnetic body, the antiferromagnetic body preferably is made of a perovskite oxide.

In another preferred embodiment of the element of the present invention, a multilayer film formed on a substrate includes the aforementioned layered-perovskite oxide, and a pair of ferromagnetic bodies formed in contact with the layered-perovskite oxide so as to sandwich the layered-perovskite oxide, wherein one of the ferromagnetic bodies (preferably the ferromagnetic body on the substrate side) is made of a perovskite oxide, an antiferromagnetic body is provided in contact with the foregoing perovskite oxide ferromagnetic body, and further, an oxide electrode that will be described later is provided in contact with the antiferromagnetic body.

When an element L is contained in the ferromagnetic body ($0 < p \leq 1$), vaporization of the element L from the layered-perovskite oxide can be suppressed. Specifically, p preferably is in the range of $0 < p \leq 0.3$. From the same viewpoint, at least one of the ferromagnetic bodies and the layered-perovskite oxide more preferably contain the same element as the element L.

With a view to attaining the MR effect, the perovskite ferromagnetic oxide and the layered-perovskite oxide preferably satisfy $0.05 \leq y \leq 0.55$ and $0.05 \leq 1-z \leq 0.55$, respectively, in the aforementioned formulae. To obtain improved compatibility between the two oxides, $0.8(1-z) \leq y \leq 1.2(1-z)$ preferably is satisfied.

Maintaining good compatibility of the foregoing materials with an electrode material is desired in order to obtain good MR characteristics. More specifically, an oxide electrode preferably is provided in contact with a ferromagnetic body made of a perovskite oxide. More preferably the foregoing oxide electrode is made of a perovskite oxide.

In this case, the oxide electrode preferably is a perovskite oxide having a higher electric conductivity than that of the ferromagnetic body made of a perovskite oxide.

The oxide electrode made of a perovskite oxide preferably has a composition expressed by the following formula:

$$(A_{1-v}R_v)_j(X_{1-r}T_r)O_{j+2-q}$$

where: A and R represent the aforementioned elements, respectively; T represents the same element as the element M contained in the ferromagnetic body in contact with the foregoing electrode (common element); X is at least one element (except the element T) selected from titanium (Ti), vanadium (V), copper (Cu), ruthenium (Ru), Nickel (Ni), and Chromium (Cr); j represents 1 or 2; and q, r, and v represent numerical values satisfying $0 \leq q \leq 1$, $0 \leq r \leq 1$, and $0 \leq v \leq 1$, respectively.

In the case where one element is contained commonly in the ferromagnetic material and the electrode ($0 < r \leq 1$), junction between the foregoing two can be maintained easily in a good state. From the same viewpoint, it is more preferable to satisfy $0.8y \leq 1-v \leq 1.2y$.

Incidentally, an element selected from the group consisting of Mn, Co, and Fe is suitable as the element M contained in the ferromagnetic body. Taking the conductivity into consideration, however, an element contained as the elements T and M is preferably an element selected from the group essentially consisting of Ru, Ti, V, and Cu.

The following description will depict the present embodiment of the present invention in more detail, while referring to the drawings.

First Embodiment

A magnetoresistive element was formed in one vacuum chamber by sputtering, using $Bi_{2.4}(La_{0.65}Sr_{0.35})_2Mn_{1.2}O_{6.9}$, $La_{0.65}Sr_{0.35}Mn_{1.1}O_{3.1}$, and $(La_{0.65}Sr_{0.35})RuO_3$ as target materials. The sputtering was conducted in a 0.5 Pa argon atmosphere containing 20 vol % of oxygen, with a discharge power of 50 W, so as to form a film on a substrate heated to approximately 600° C.

Figure 1B:
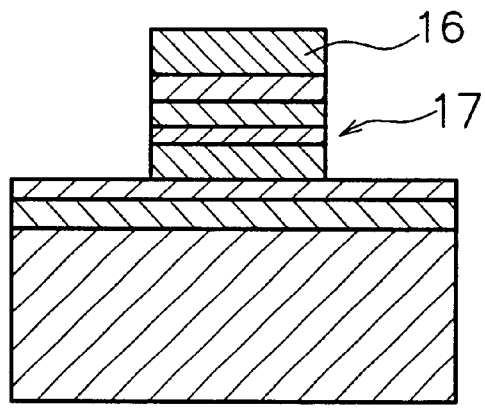
Figure 1C:
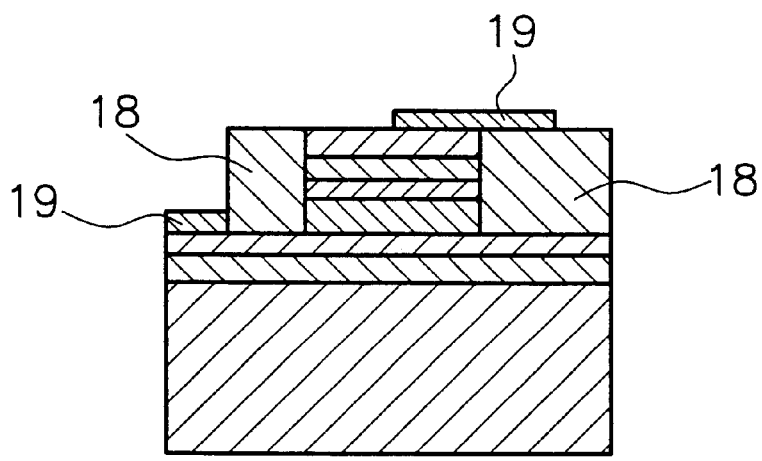

The process of forming the element is shown in FIGS. 1A to 1C: $(La_{0.65}Sr_{0.35})MnO_3$ and $(La_{0.65}Sr_{0.35})RuO_3$ were deposited in the stated order on a $SrTiO_3(100)$-surface substrate 11 to thicknesses of 20 nm and 50 nm, respectively, to form a buffer layer 12 and a thin film 13 as a lower oxide electrode, respectively; then, a magnetoresistive tunnel junction layer 14 in which a $Bi_2(La_{0.65}Sr_{0.35})_2MnO_6$ thin film 21 was sandwiched between $(La_{0.65}Sr_{0.35})MnO$, thin films 20 and 22 from above and below was formed thereon; further, $(La_{0.65}Sr_{0.35})RuO_3$ was deposited thereon to a thickness of 20 nm to form a thin film 15 as an upper oxide electrode (FIG. 1A). Incidentally, a thickness of the $Bi_2(La_{0.65}Sr_{0.35})MnO_6$ layer 21 was varied in a range of 0.4 nm to 100 nm in terms of a volume velocity. It was confirmed by X-ray diffraction and cross-section structure analysis that these thin films were grown with the c axis being oriented perpendicularly to the substrate surface. Subsequently, annealing was carried out in an oxygen-nitrogen mixture atmosphere at approximately 500° C. to approximately 800° C.

Next, a photoresist 16 was formed, which was patterned so as to have an aspect ratio of 1:2.5, and an element width of 0.2 μm to 10 μm. It is preferable that the aspect ratio is 1.5/1 (1:1.5) or more since the anisotropy of magnetization of the ferromagnetic layer increases. In memory devices, the aspect ratio 5/1 (1:5) or less is appropriate for integration density. The element preferably has a round corner since it makes the rotation of the magnetization direction.

Figure 2:
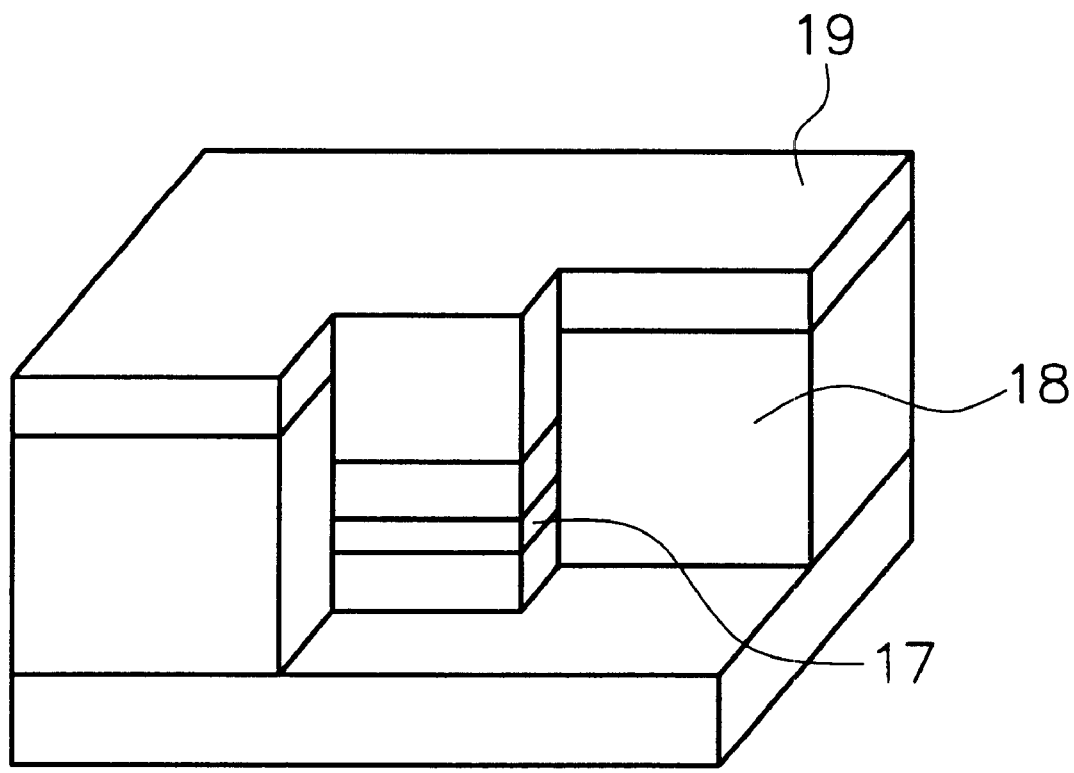
FIG. 2 is a partly-cutaway perspective view illustrating an embodiment of a magnetoresistive element of the present invention.

Thereafter, etching was carried out with argon ions, so that a junction section 17 was carved out (FIG. 1B). Thereafter, an insulating-separating layer 18 ($Al_2O_3$, $SiO_2$, or $CaF_2$) was formed, then, a wire of gold (Au) was provided as a lead electrode 19 so as to be in contact with the oxide electrode. Thus, the element was finished (FIG. 1C). FIG. 2 is a partly-cutaway perspective view of a portion of the junction thus formed.

Figure 3A:
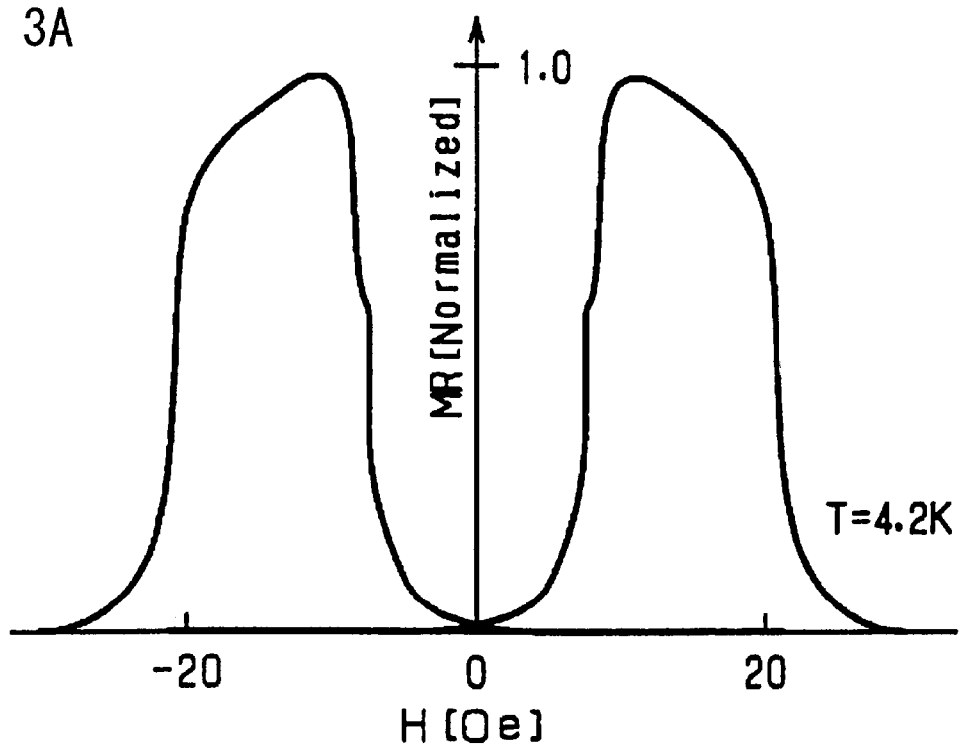
FIGS. 3A and 3B are graphs showing MR characteristics of magnetoresistive elements according to an embodiment of the present invention.

A magnetoresistive (MR) characteristic of the foregoing element at 4.2K was measured, so as to examine the MR characteristic depending on the thickness of the tunnel junction layer in the element. FIG. 3A illustrates a MR characteristic when $(La_{0.65}Sr_{0.35})MnO_3$, $Bi_2(La_{0.65}Sr_{0.35})_2MnO_6$, and $(La_{0.65}Sr_{0.35})MnO_3$ were 20 nm, 1.5 nm, and 15 nm in thickness, respectively. Such a MR characteristic was obtained with good reproducibility when the $Bi_2(La_{0.65}Sr_{0.35})_2MnO_6$ in the junction layer had a thickness ranging from 1 nm to 10 nm.

A clear MR effect of $(La_{0.65}Sr_{0.35})MnO_3$, which is MR material, as bulk crystal was recognized at a magnetic field in the order of 10000 G, while a MR effect of the element thus formed was obtained at a low magnetic field of several tens G. This MR effect was recognized at room temperature, though being decreased. This is considered as reflecting a characteristic of $(La_{1-y}Sr_y)MnO_3$ as bulk crystal having a Curie temperature that becomes not lower than room temperature when $0.18 \leq y \leq 0.6$.

Moreover, in the measurement at 4.2K, a MR effect was detected when the ferromagnetic layers were made of $(La_{1-y}Sr_y)MnO_3$ $(0.1 \leq y \leq 0.55)$. In this case, when the composition of $Bi_2(La_zSr_{1-z})_2MnO_6$ was further limited so as to satisfy $0.1 \leq 1-z \leq 0.55$, the MR effect was exhibited more effectively. Furthermore, the MR effect was obtained stably when $0.8(1-z) \leq y \leq 1.2z$ was satisfied.

The foregoing outcome was obtained when A (alkaline earth element)=Sr. Likewise, a clear MR effect was detected at 4.2K, in the case where A=Ba, with y in the ferromagnetic layers satisfying $0.05 \leq y \leq 0.5$, and in the case where A=Ca, with y satisfying $0.18 \leq y \leq 0.5$.

Besides, in the case where the ferromagnetic layers used contained Mn (M=Mn) as described above, a Ru(X) site of the electrode layer oxide $(La,Sr)RuO_3$ was partly substituted with Mn(M) so that the oxide was expressed by the composition formula of $(La,Sr)(Ru,Mn)O_3$. In this case, the characteristic degradation was suppressed even if being subjected to the annealing process after the film formation. A preferable substitution rate of Ru to Mn was approximately 0.01% to 5%.

In this element, $(La,Sr)(Ru,Mn)O_3$, $(La,Sr)MnO_3$, $Bi_2(La_{0.65}Sr_{0.35})_2MnO_6$, $(La,Sr)MnO_3$, and $(La,Sr)(Ru,Mn)O_3$ were deposited on $(La,Sr)(Ru,Mn)O_3$. In the electrode layer oxide, the alkaline earth element (A) and the rare earth element (R) were the same as the elements A and R of the ferromagnetic layers, respectively. These elements also were contained in the buffer layer.

Also in the case where $(La,Sr)(Mn,M')O_3$, $Bi_2(La_{0.65}Sr_{0.35})_2(Mn,M')O_6$, and $(La,Sr)(Mn,M')O_3$ were deposited so as to form the junction section through a process as above (M' is an element M other than Mn), a junction interface was allowed to have good continuity. This was found by observation of a cross section of the junction section by a transmission electron microscope or the like. In this case, a suitable substitution rate of M' to Mn in $(La,Sr)(Mn,M')O_3$ forming a ferromagnetic layer was approximately 0.01% to 5%. On the other hand, in the layered-perovskite oxide of $Bi_2(La_{0.65}Sr_{0.35})_2(Mn,M')O_6$, an excellent junction interface was obtained when a substitution rate of M' was in a range of 0% to 100%.

In the case of a configuration formed by depositing $(La,Sr)(Ru,Mn)O_3$, $(La,Bi,Sr)MnO_3$, $Bi_2(La,Sr)_2MnO_6$, $(La,Bi,Sr)MnO_3$, and $(La,Sr)(Ru,Mn)O_3$ in which ferromagnetic layers have a composition of $(La,Bi,Sr)MnO_3$, a more effective suppressing effect was recognized. This outcome is considered to have been obtained because mutual diffusion of the element L (here, Bi) induced by a heat treatment at the layer interface was suppressed. The element L easily vaporizes and diffuses as compared with the other elements. The rate of substitution with the element L at the La (R) sites in the ferromagnetic layers was preferably in a range of approximately 0.1% to 30%, and more preferably up to 20%.

The reason why the foregoing element attained high sensitivity seems: that the barrier layer was present in crystal itself; that the manganese oxide and the barrier layer had good compatibility with each other; and that the magnetoresistive tunnel junction layer and the oxide electrode layers had good compatibility with each other. Since the foregoing element was particularly configured so that the magnetoresistive tunnel junction layer was provided on the substrate, with the buffer layer and the oxide electrode layer being interposed therebetween, a MR characteristic with further improved sensitivity was obtained as compared with an element without such layers.

Figure 4:
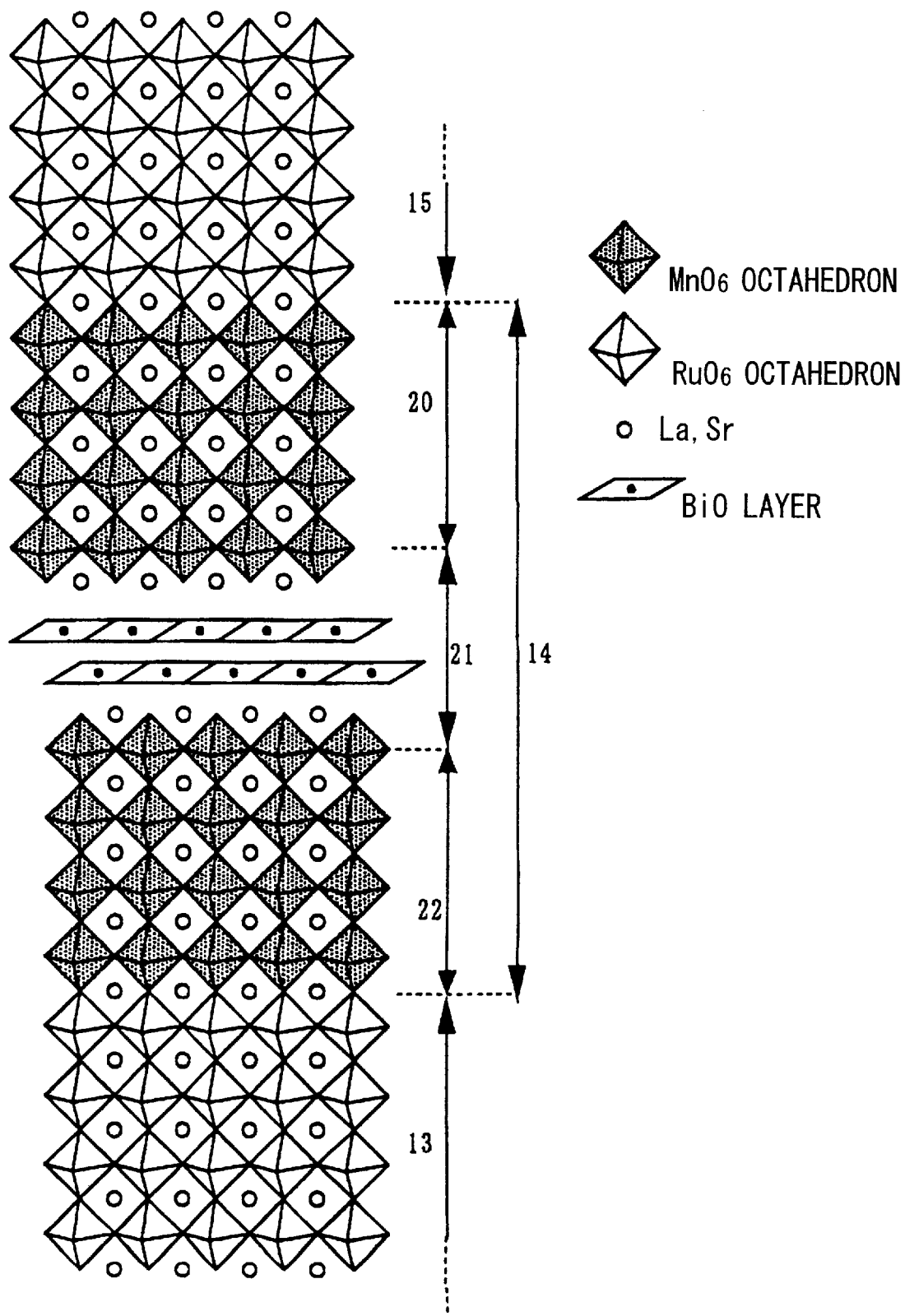
FIG. 4 is a view illustrating a crystalline structure in the vicinity of a junction section of a magnetoresistive element according to an embodiment of the present invention.
Figure 5:
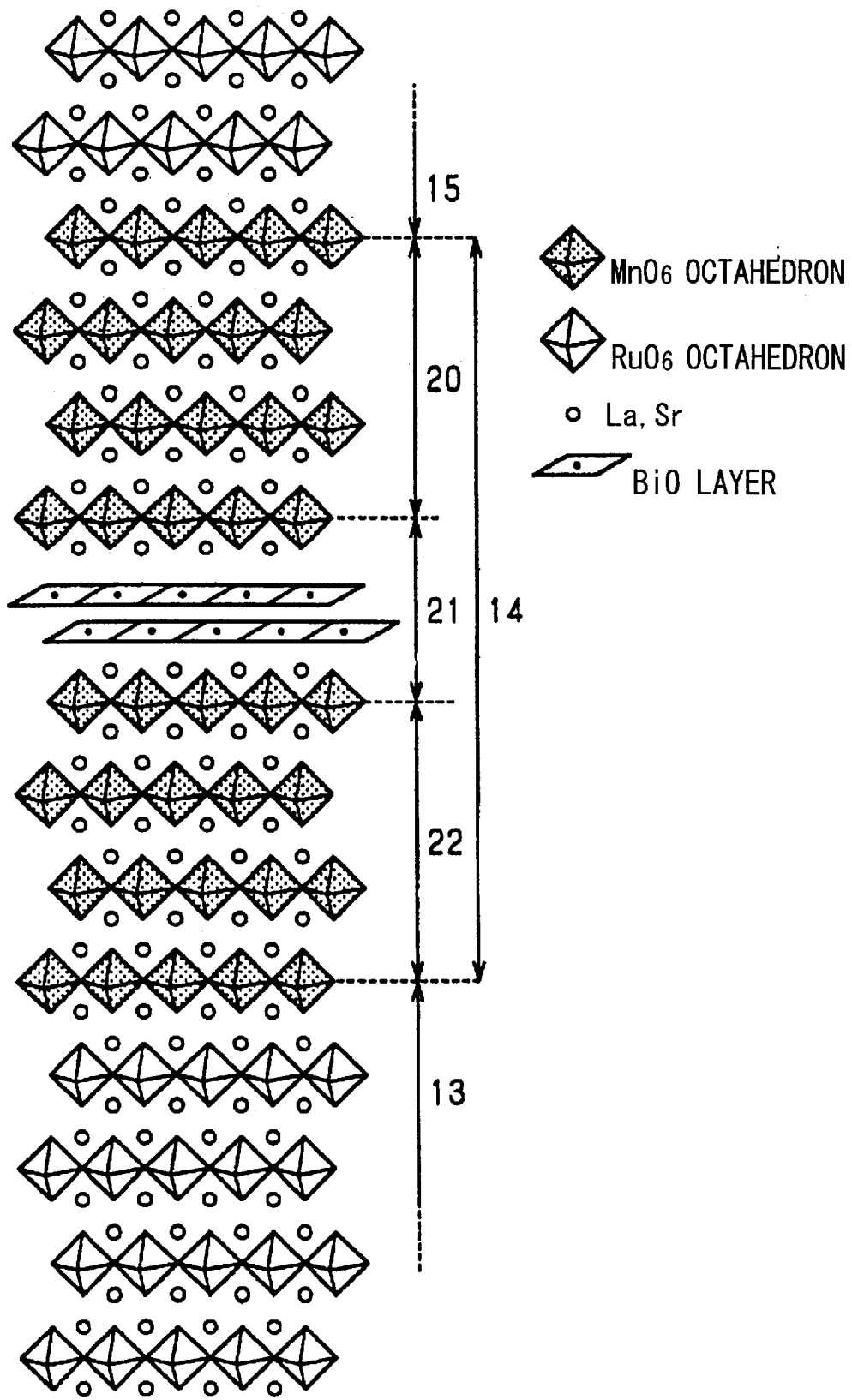
FIG. 5 is a view illustrating a crystalline structure in the vicinity of a junction section of a magnetoresistive element according to another embodiment of the present invention.

FIG. 4 schematically illustrates a crystalline structure in the vicinity of the junction interface of the oxide electrode layer to the magnetoresistive tunnel junction layer. FIG. 5 schematically illustrates, as another example, a crystalline structure in the vicinity of a junction interface in the case of a combination of a $Bi_2(La,Sr)_2MnO_6$ thin film (barrier layer: 21), $(La,Sr)_2MnO_4$ thin films (ferromagnetic layers: 20, 22), and $(La,Sr)_2RuO_4$ thin films (oxide electrodes: 13, 15). As shown in the drawings, crystalline structures of the magnetoresistive tunnel junction layer and the oxide electrode layer in the vicinity of the interface therebetween have good compatibility, and so do those of the ferromagnetic layer and the barrier layer in the vicinity of the interface therebetween. It is considered that with such excellent junction, it was possible to provide a magnetoresistive tunnel junction element with high sensitivity.

Furthermore, in the present embodiment, a MR characteristic was obtained at a further lower magnetic field as compared with the characteristic results of the $(La_{0.67}Sr_{0.33})MnO_3/SrTiO_3$ (6 nm)/$(La_{0.67}Sr_{0.33})MnO_3$ junction proposed by Y. Lu et al. (Y. Lu et al.: Phys. Rev. Lett. 54(1996)R8357 supra). This seems to have resulted from smooth continuity of structures as shown in FIGS. 4 and 5 that in turn realized a junction interface having good continuity.

Incidentally, (La,Sr)RuO$_3$ was used to form oxide electrodes in the aforementioned case, but it also was confirmed that a magnetoresistive element could be configured operable using any one of perovskite complex oxides expressed by the aforementioned formula $(R_{1-y}A_y)_jXO_{j+2-q}$, for instance, (La,Sr)$_2$RuO$_4$, (La,Sr)$_2$CuO$_4$, (La,Sr)VO$_3$, or the like. Suitable operation was confirmed also in the case where Sr$_2$RuO$_4$, or SrVO$_3$ was used for forming an oxide electrode (v=1). However, substitution of a part of Sr (A) with a rare earth element (0<y<1) is preferable, from the viewpoint of the stability of the element structure. Besides, in the case where a buffer layer is used, an oxide electrode layer may be provided directly on the substrate, considering compatibility with a junction layer including ferromagnetic layers.

Second Embodiment

A magnetoresistive element was formed in one vacuum chamber by sputtering, using (La$_{0.65}$Sr$_{0.35}$)Mn$_{1.2}$O$_{3.1}$, Bi$_{2.4}$(La$_{0.65}$Sr$_{0.35}$)$_2$CaCu$_{2.4}$O$_8$, and (La$_{0.85}$Sr$_{0.15}$)$_2$CuO$_4$ as target materials. The sputtering was conducted in a 0.5 Pa argon atmosphere containing 20 vol % of oxygen with discharge power of 50 W, so as to form a film on a substrate heated to approximately 600° C.

More specifically, (La$_{0.85}$Sr$_{0.15}$)$_2$CuO$_4$ was deposited to a thickness of 50 nm on a SrTiO$_3$(100)-surface substrate. Thereon, a 50 nm-thick (La$_{0.65}$Sr$_{0.35}$)MnO$_3$ thin film, a Bi$_2$(La$_{0.65}$SrSr$_{0.35}$)$_2$CaCu$_2$O$_8$ thin film, a 50 nm-thick La$_{0.65}$Sr$_{0.35}$MnO$_3$ thin film, and a 20 nm-thick (La$_{0.85}$Sr$_{0.15}$)$_2$CuO$_4$ thin film were formed in the stated order. The thickness of the Bi$_2$(La$_{0.65}$Sr$_{0.35}$)$_2$CaCu$_2$O$_8$ thin film was varied in a range of 0.4 nm to 50 nm in terms of volume velocity. It was confirmed that these thin films were grown with the c axis being oriented perpendicularly to the substrate surface.

Subsequently, a photoresist was formed, which was patterned so as to have an aspect ratio of 1:2.5, and an element width of 0.2 μm to 10 μm. Thereafter, etching was carried out with argon ions, so that a junction section was carved out. Thereafter, an Al$_2$O$_3$ thin film was formed as an interlayer insulating-separating layer, and then a lead electrode was formed by using Cu and Pt. Thus, the element was finished. The junction thus formed was in an identical shape to that shown in FIGS. 1 and 2.

Figure 3B:
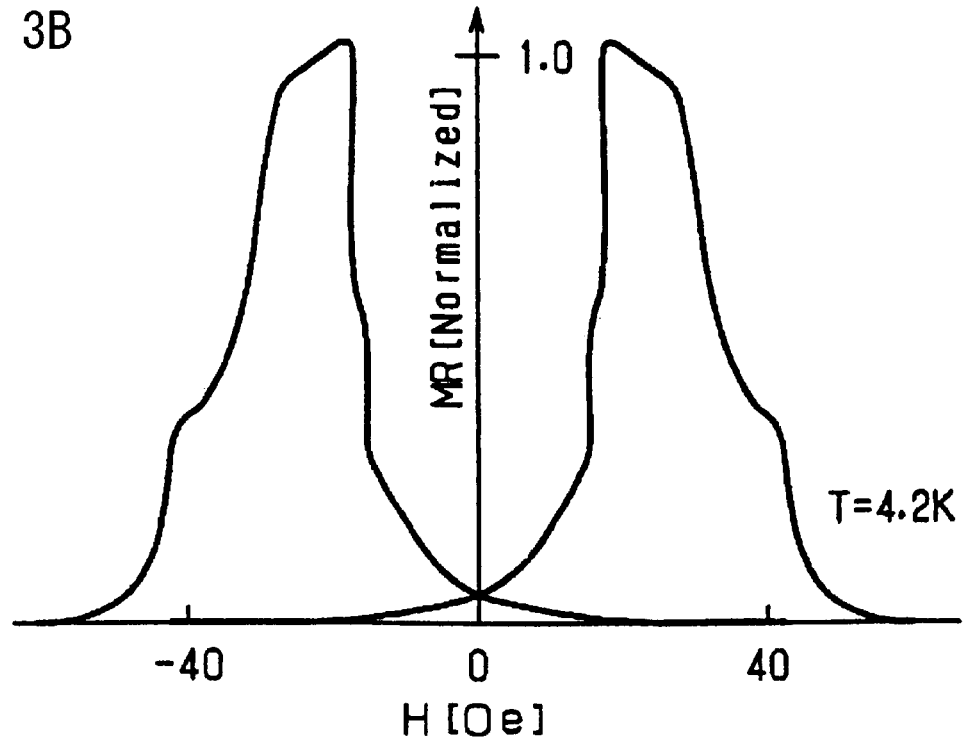

A magnetoresistive (MR) characteristic of the foregoing element at 4.2K was measured, and a clear MR effect was recognized. FIG. 3B illustrates a MR characteristic when the Bi$_2$(La$_{0.65}$Sr$_{0.35}$)$_2$CaCu$_2$O$_8$ film was 3 nm thick. Such a MR characteristic was obtained with good reproducibility when the Bi$_2$(La$_{0.65}$Sr$_{0.35}$)$_2$CaCu$_2$O$_8$ thin film had a thickness ranging from 1.5 nm to 10 nm.

Bi$_2$(La$_{0.65}$Sr$_{0.35}$)$_2$CaCu$_2$O$_8$ is a substance that as a bulk exhibits superconductivity at not higher than approximately 70K. Additionally, also the oxide electrode (La$_{0.85}$Sr$_{0.15}$)$_2$CuO$_4$, which also functions as a buffer layer, as a bulk exhibits superconductivity at not higher than approximately 30K. Therefore, no electrode resistance appeared in the TMR characteristic evaluated at not higher than 4.2K in a four-electrode configuration, and hence a characteristic of the junction per se could be evaluated. To obtain superconductivity, the oxide electrode is preferably made of a material expressed as (La$_{1-x}$Sr$_x$)$_2$CuO$_4$ where x satisfies $0.05 \leq x \leq 0.3$. Further, to obtain superconductivity with the layered-perovskite complex oxide, the oxide preferably is expressed as Bi$_2$(Sr,Ca)$_{3-x}$La$_x$Cu$_2$O$_8$ where x satisfies $0 \leq x \leq 0.5$.

Third Embodiment

A magnetoresistive element was formed in one vacuum chamber by laser ablation, using (La$_{0.85}$Sr$_{0.15}$)$_2$Cu$_{12}$O$_{4.2}$, Tl$_2$Ba$_2$Ca$_2$Mn$_3$O$_{12}$, and Tl$_2$Mn$_2$O$_7$ as target materials. The target ablation was conducted in an oxygen atmosphere at 5 Pa to 70 Pa with laser power of approximately 1 to 5 J/cm$^2$, so as to form a film on a substrate heated to approximately 600° C. to 700° C.

LaCuO$_3$ and (La$_{0.85}$Sr$_{0.15}$)$_2$CuO$_4$ were deposited, on a SrTiO$_3$(100)-surface substrate to thicknesses of 20 nm and 50 nm, respectively, to form a buffer layer and a thin film as a lower oxide electrode, respectively. Thereon, a junction layer composed of a (La$_{0.8}$Sr$_{0.2}$)MnO$_3$ thin film, a Tl$_2$Ba$_2$Ca$_2$Mn$_3$O$_{12}$ thin film, and a Tl$_2$Mn$_2$O$_7$ thin film were formed, on which (La$_{0.85}$Sr$_{0.15}$)$_2$CuO$_4$ was deposited to a thickness of 20 nm to form a thin film as an upper oxide electrode. The junction layer was configured so that the thin films of (La$_{0.8}$Sr$_{0.2}$)MnO$_3$, Tl$_2$Ba$_2$Ca$_2$Mn$_3$O$_{12}$, and Tl$_2$Mn$_2$O$_7$ were 20 nm, 4.5 nm, and 25 nm in thickness, respectively. It was confirmed that these thin films were grown with the c axis being oriented perpendicularly to the substrate surface. Incidentally, Tl$_2$Mn$_2$O$_7$ is a pyrochlore-type oxide.

Subsequently, a photoresist was formed, which was patterned so as to have an aspect ratio of 1:2.5 and an element width of 0.2 μm to 10 μm. Thereafter, etching was carried out with argon ions, so that a junction section was carved out. Thereafter, a CaF$_2$ thin film was formed as an insulating-separating layer, and then a lead electrode was formed with gold. Thus, the element was finished. The junction thus formed was in an identical shape to that shown in FIGS. 1 and 2.

A magnetoresistive (MR) characteristic of the foregoing element at 135K was measured, and a clear MR effect was recognized. Incidentally, a MR characteristic also was recognized in the case where Bi$_{1.4}$Tl$_{0.6}$Sr$_2$Ca$_2$Mn$_3$O$_{12}$ was used instead of Tl$_2$Ba$_2$Ca$_2$Mn$_3$O$_{12}$.

In each of the foregoing embodiments, the same MR characteristic was recognized when another rare earth element (R) was used, and excellent reproducibility was obtained particularly when any one of La, Pr, Nd, and Sm was used.

Fourth Embodiment

A 50 nm-thick SrRuO$_3$ thin film and a 50 nm-thick LaFeO$_3$ thin film were formed in the stated order on a SrTiO$_3$(100)-surface substrate by sputtering as described above. Thereon, a function layer composed of a 5 nm-thick (La$_{0.6}$Bi$_{0.05}$Sr$_{0.35}$)MnO$_3$ thin film, a 3 nm-thick Bi$_2$(La$_{0.65}$Sr$_{0.35}$)$_2$MnO$_6$ thin film, and a 10 nm-thick (La$_{0.6}$Bi$_{0.05}$Sr$_{0.35}$)MnO$_3$ film were formed. Here, the sputtering was conduced also under the conditions of a 0.5 Pa argon atmosphere containing 20% of oxygen and discharge power of 50 W, but the substrate temperature was set to approximately 650° C.

The thickness of the Bi$_2$(La$_{0.65}$Sr$_{0.35}$)$_2$MnO$_6$ thin film was varied in a range of 0.4 nm to 10 nm in terms of a volume velocity. It was confirmed that these thin films were grown with the c axis being oriented perpendicularly to the substrate surface. Subsequently, annealing was carried out in an oxygen-nitrogen mixture atmosphere at approximately 500° C. to approximately 800° C.

Subsequently, the substrate was cooled to room temperature, and Ni—Co—Fe, Ni$_{0.8}$Fe$_{0.2}$, and Ta were deposited to form thin films of approximately 50 nm, 10 nm, and 10 nm in thickness, respectively.

Next, a photoresist was formed, which was patterned in an element area of 0.35 μm×7 μm, and thereafter, etching was carried out with argon ion, so that a junction section was carved out. Thereafter, a $SiO_2$ thin film was formed as an insulating-separating layer, and then a lead electrode was formed. Thus, the element was finished.

In this element, the $SrRuO_3$ thin film was a lower oxide electrode that also functions as a buffer layer, the $LaFeO_3$ thin film was an antiferromagnetic body, which caused the $(La_{0.6}Bi_{0.05}Sr_{0.35})MnO_3$ thin film in contact therewith to be a pinned ferromagnetic layer. The $LaFeO_3$ thin film was a perovskite oxide as well. On the other hand, the Ni—Co—Fe thin film, together with the $(La_{0.6}Bi_{0.05}Sr_{0.35})MnO_3$ thin film in contact therewith, functioned as a free ferromagnetic layer, while the $Ni_{0.8}Fe_{0.2}$ thin film functioned as an upper electrode. The Ta thin film was a base film on which a wire electrode material (herein, mainly Cu) was to be provided.

A composition of the Ni—Fe—Co thin film, expressed as $Ni_xCo_yFe_z$, preferably was set to satisfy $0.6 \leq x \leq 0.9$, $0 \leq y \leq 0.4$, and $0 \leq z \leq 0.3$, so as to be a Ni-rich magnetic film, or alternatively, to satisfy $0 \leq x \leq 0.4$, $0.2 \leq y \leq 0.95$, and $0 \leq z \leq 0.5$, so as to be a Co-rich magnetic film (provided, however, that $x+y+z=1$).

A magnetoresistive (MR) characteristic of the foregoing element at 4.2K was measured, and a clear MR effect with good reproducibility was recognized when the $Bi_2(La_{0.65}Sr_{0.35})_2MnO_6$ thin film had a thickness ranging from 1.2 nm to 10 nm. The MR effect was obtained at a low magnetic field of several G.

$LaFeO_3$ as a bulk exhibits antiferromagnetism at the measurement temperature. When $R'FeO_3$ ($R'=Y$, Sm, Eu, Gd, Dy, Ho, Er) was used in place of $LaFeO_3$, the same characteristic was observed.

Incidentally, in each of the foregoing embodiments, $SrTiO_3(100)$, which is a cubic substance, was used to form the substrate, but a cubic substance such as $LaSrGaO_4(001)$, an orthorhombic substance such as $LaAlO_3(001)$, $YAlO_3(001)$, $Nd:YAlO_3(001)$, or $LaGaO_3(001)$, or another cubic substance (for instance, MgO) may be used. Further, $Nd:SrTiO_3(100)$, for instance, may be used so that an electrode body can be used as the substrate.

Fifth Embodiment

In the present embodiment, an in-plane-type magnetoresistive element was formed utilizing an oblique substrate as shown in FIG. 6.

A $SrTiO_3(001)$-surface substrate having a tilt of approximately 1° in the [100] direction was used as a substrate 43. The surface of the substrate included terrace surfaces. On the substrate, a 1 nm to 20 nm-thick $(La_{0.65}Sr_{0.35})MnO_3$ thin film, a 1.5 nm to 10 nm-thick $Bi_2(La_{0.6}Sr_{0.4})CaMnO_6$ thin film, a 1 nm to 20 nm-thick $(La_{0.65}Sr_{0.35})MnO_3$ thin film, and a 5 nm to 100 nm-thick $SrRuO_3$ thin film were formed in the stated order on the substrate, so as to form a laminated body 41 including a junction layer. The film formation was carried out by sputtering, in an 0.5 Pa argon atmosphere containing 20% of oxygen, with discharge power of 50 W, onto a substrate heated to approximately 650° C.

Figure 6A:
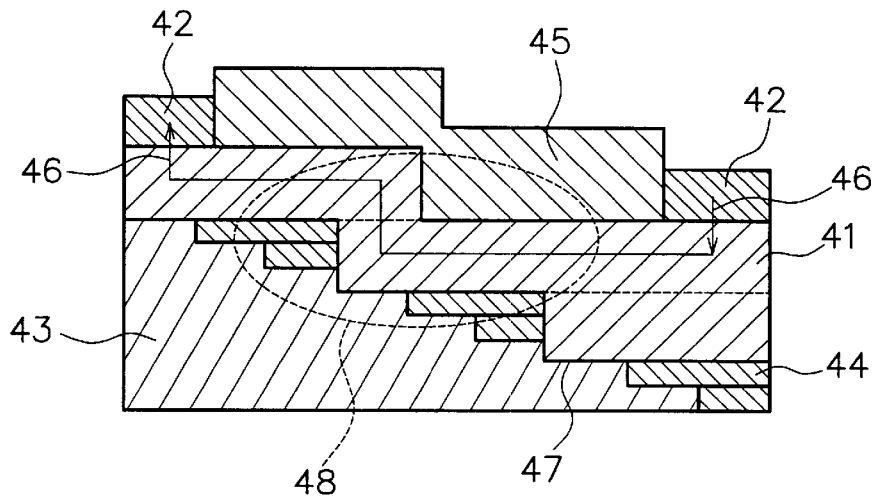
FIG. 6A is a cross-sectional view of a magnetoresistive element according to an embodiment of the present invention.
Figure 6B:
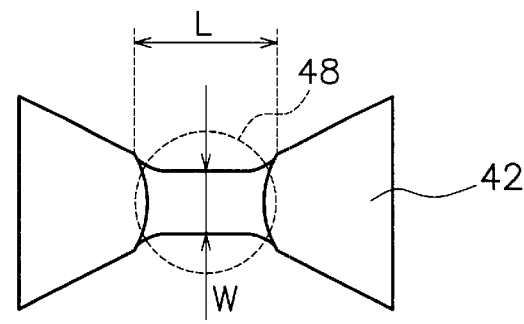
FIG. 6B is a plan view of the foregoing element.

An element structure as shown in FIGS. 6A and 6B was obtained by submicron processing by exposure utilizing a stepper or an electron beam. A laminated body 41 was formed on an oblique substrate surface 47 of the foregoing substrate by growing while forming steps. This is because crystal growth of the base materials was reflected. On portions 44 unconformable with the steps, hetero-phase substances were provided. Incidentally, FIG. 6A shows steps of the laminated body 41 that are provided at a cycle three times a cycle of the steps of the substrate, but the configuration is not limited to this. There are many patterns, and it was confirmed that elements are formed where steps are provided at a cycle of three to ten times.

A bias path 46 formed between lead electrodes 42 formed with gold (Au) ran through the laminated body 41 in the film thickness direction at the step portion as denoted with an arrow. Both the lead electrodes 42 are in contact with the oxide electrode $SrRuO_3$ in an upper part of the laminated body. To suppress degradation of the element, an $Al_2O_3$ thin film was formed as a cover layer 45, so as to cover the element. An area processed to be an element was approximately 50 nm (W)×approximately 100 nm (L) (FIG. 6B). It was confirmed that a MR effect was obtained from the element thus formed, at a low magnetic field of several tens G.

Incidentally, though herein an oblique substrate with a tilt angle of approximately 1° was used, it is possible to obtain a similar element by using an oblique substrate with a tilt angle of 0.1° to 10°. The substrate material also is not particularly limited to the $SrTiO_3(001)$-surface substrate.

Materials of the foregoing element that were confirmed to provide a MR effect are shown in Table 1. In Table 1, the film A is equivalent to the $SrRuO_3$ film in the foregoing example, while the film B is equivalent to the $La_{0.65}Sr_{0.35}MnO_3$ thin film in the foregoing example. The other thin films were configured as described above. The size of the junction section is that shown in FIG. 6B (L×W).

TABLE 1

| FILM A | FILM B | MR VALUE | JUNCTION SECTION (nm) |
|---|---|---|---|
| $Bi_2(La_{0.65}Sr_{0.35})_2CuO_6$ | $(La_{0.65}Sr_{0.35})_2MnO_4$ | 68% (20K) | 50 × 30 |
| $Bi_2(La_{0.65}Sr_{0.35})_2RuO_6$ | $(La_{0.65}Sr_{0.35})_2MnO_4$ | 34% (room temp.) | 80 × 40 |
| $Bi_2(La_{0.65}Sr_{0.35})_2RuO_6$ | NiMnSb | 28% (room temp.) | 70 × 40 |

Figure 6C:
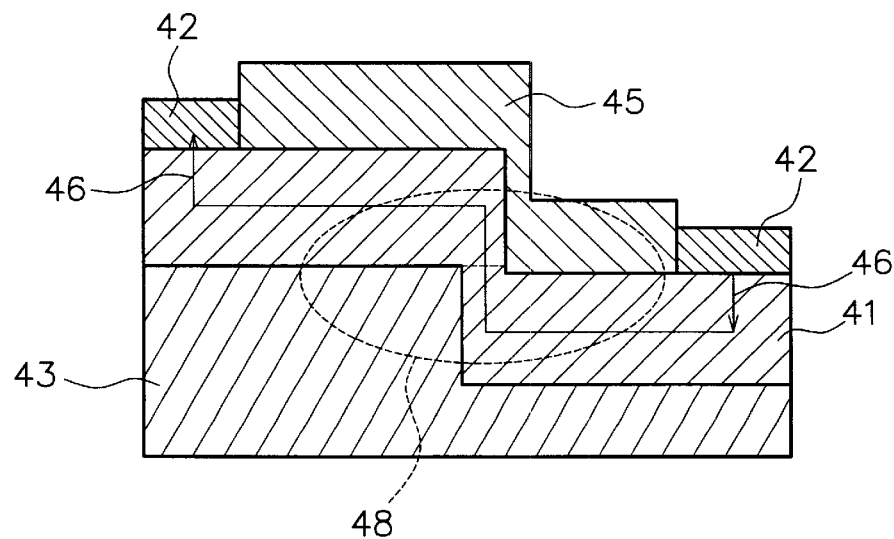
FIG. 6C is a cross-sectional view of a modification of the foregoing element.

Alternatively, a processed substrate in a stepped shape as shown in FIG. 6C may be used. It was confirmed that an element using the stepped substrate through the process described above (the junction section was 50 nm×50 nm in size) provided an identical MR effect. It was recognized that the resistance of the element tended to increase when the stepped substrate was used, as compared with the case where the oblique substrate was used. The two types of substrates may be selected according to the element characteristics needed. The step angle is not limited to the right angle and is preferably about 70° to about 90°.

Sixth Embodiment

A magnetic head was produced using a magnetoresistive element.

Figure 7B:
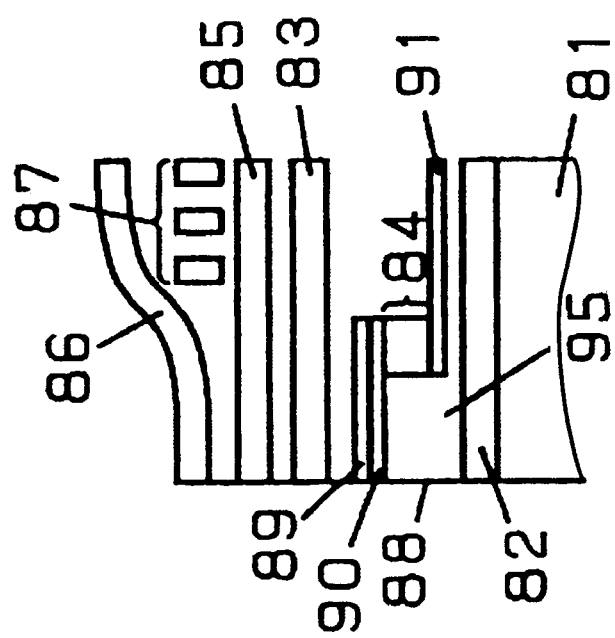
FIG. 7B is a cross-sectional view of the foregoing head.
Figure 7A:
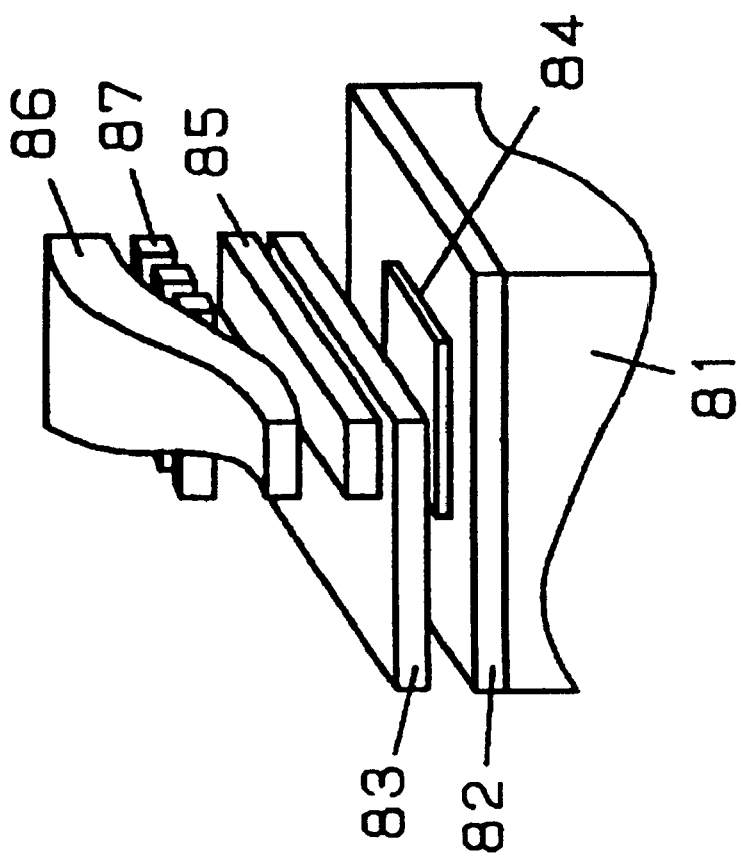
FIG. 7A is a perspective view illustrating a schematic configuration of a magnetic head that is formed utilizing an element of the present invention.

A configuration of the magnetoresistive head produced is shown in FIGS. 7A and 7B. Incidentally, sputtering was carried out for film formation.

In the foregoing magnetic head, single crystal $SrTiO_3$ was used to form a substrate 81, a $(La_{0.65}Sr_{0.35})RuO_3$ thin film was used to form a lower shield layer 82, and NiFe alloy thin films were used to form an upper shield layer 83 and recording magnetic poles 85 and 86 disposed above and below a coil 87. Each of the shield layers was 100 nm thick, while each of the recording magnetic poles was 3 μm thick. Each gap layer between the foregoing layers was formed with a $SrTiO_3$ thin film. Each of the gap layers between the shield layers and the magnetoresistive element 84 had a thickness of 0.1 μm, and each of those between the shield layers and the recording magnetic poles had a thickness of 0.2 μm. A gap between a reproducing head and a recording head was set to approximately 4 μm, and a gap layer for the gap was formed with an $Al_2O_3$ thin film. An insulator section 95 separates the magnetoresistive element 84 from a head surface 88, so as not to be exposed directly on the head surface 88. A lead electrode 89 was formed mainly with Cu, and a lead electrode 91 was formed with $(La_{0.65}Sr_{0.35})RuO_3$. A coil was formed with a 3 µm-thick Cu thin film. $SrTiO_3$ was used to form the insulator section 95.

The magnetoresistive element 84 was configured by laminating the following thin films in the stated order: a $(La_{0.65}Sr_{0.35})_2MnO_4$ thin film or a $(La_{0.65}Sr_{0.35})MnO_3$ thin film, 20 nm thick, as a lower ferromagnetic layer; a $Bi_2(La_{0.65}Sr_{0.35})_2MnO_6$ thin film, 3 nm thick, as a junction layer; and a Ni—Fe—Co— thin film, 50 nm thick, as an upper ferromagnetic layer. A composition of the Ni—Fe—Co is preferably Ni-rich, or Co-rich, as described above. Further, a 50 nm-thick thin film either made of $Ni_{81}Fe_{19}$ or having the same composition as that of the upper ferromagnetic layer was used to form a magnetic layer 90 that was in contact with the upper ferromagnetic layer.

The two ferromagnetic layers in the foregoing magnetoresistive element 84 were formed so that magnetization directions crossed each other at right angles. Upon application of a bias current across the electrodes 89 and 91, a shift of the magnetization direction of the upper ferromagnetic layer according to a magnetic field applied thereto via the magnetic layer 90 was read as a change in the magnetic resistance, based on which a signal was reproduced.

Figure 8A:
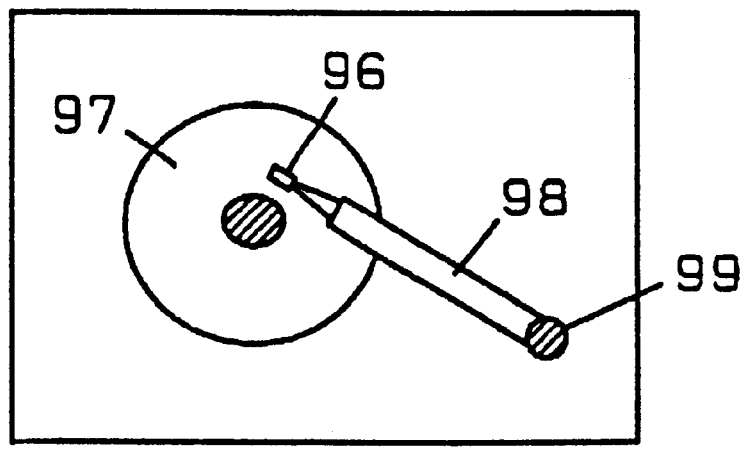
FIG. 8A is a plan view illustrating an example of a magnetic disk device that is formed utilizing the magnetic heads shown in FIGS. 7A and 7B.
Figure 8B:
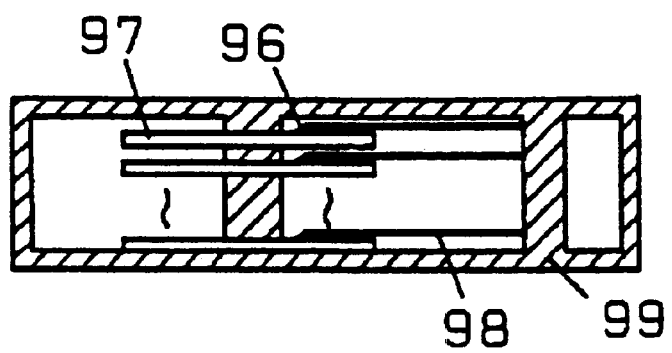
FIG. 8B is a cross-sectional view of the foregoing device.

FIGS. 8A and 8B illustrate an example of a magnetic disk device using a magnetic head. The magnetic head 96 was attached at an end of a magnetic head supporting section 98, and was driven by a magnetic head driving section 99 provided at the other end of the supporting section 98. As illustrated in FIG. 8B, a plurality of the magnetic heads 96 and magnetic disks were used in a state of being stratified in a disk thickness direction. A width of a track may be, for instance, set to 5 µm. A Co—Ni—Pt—Ta-based alloy, for instance, was useful to form the magnetic disk 97.

The magnetoresistive element 84 exhibited a higher resistance change, and hence a higher reproducing power, than a conventional GMR element of the CIPMR type did; therefore the magnetoresistive element 84 excelled as a reproduction-use magnetic head. A magnetic disk device produced using the element 84 thus formed was capable of detecting voltage changes according to signals recorded in a magnetic recording medium with good sensitivity.

The magnetic head discussed in the present embodiment is configured so that magnetoresistive tunnel current flows upon application of a current bias, by providing a pair of ferromagnetic bodies sandwiching the foregoing layered-perovskite oxide therebetween, one of the ferromagnetic layers being a free ferromagnetic layer, the other being a pinned ferromagnetic layer in contact with an antiferromagnetic layer. The pinned ferromagnetic layer and the free ferromagnetic layer are magnetized beforehand in directions crossing each other at right angles.

Seventh Element

A MRAM device as a magnetic recording element was produced by providing magnetoresistive elements as recording cells in a matrix form. Herein also the sputtering method was applied.

Techniques for recording and reading information to and from a magnetic memory element include a technique utilizing a difference between coercive forces and a technique utilizing a combination of a free layer and a pinned layer. In the former technique, memory information is read out in the following manner: magnetization directions are recorded in a layer having a relatively greater coercive force, and a magnetization of a layer having a relatively smaller coercive force is inverted by applying an external magnetic field having a smaller force than that of the magnetic field applied previously; a change occurs in the resistance of the element according to parallel and antiparallel alignments of magnetization in the two layers, and memory information is read out according to the change. In the latter technique, one of ferromagnetic layers is provided adjacent to an antiferromagnetic body so that magnetization directions thereof are pinned, while the other ferromagnetic layer is used as a free layer whose magnetization is easily inverted by an external magnetic field, so that memory information is recorded and read out according to changes in the resistance of the element according to parallel and antiparallel alignments of magnetizations in the pinned layer and the free layer.

The magnetoresistive element according the present invention can be applied to a memory element using a pinned layer and a free layer, but herein a demonstration was carried out using a configuration utilizing the coercive force difference.

Figure 9:
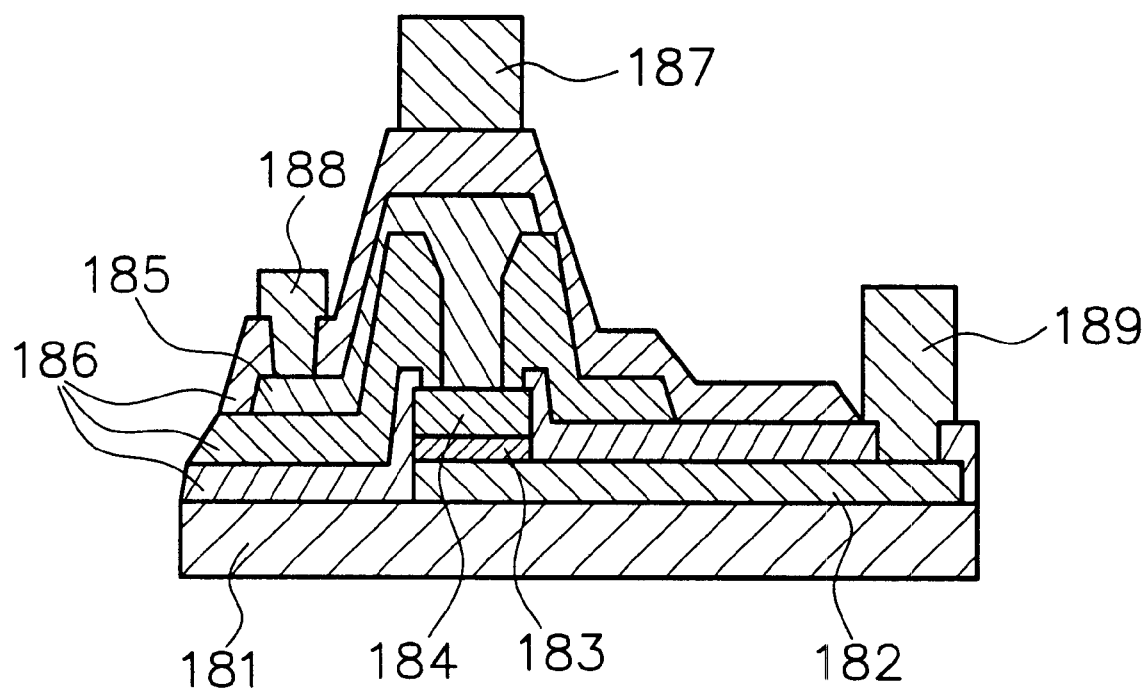
FIG. 9 is a cross-sectional view of a magnetic memory element that is formed utilizing magnetoresistive elements of the present invention.

As illustrated in FIG. 9, $(La_{0.65}Sr_{0.35})RuO_3$ was deposited to a thickness of 50 nm on a substrate 181 formed with single crystal $SrTiO_3$, to form a thin film serving as a buffer layer and a lower oxide electrode 182. Further, on the buffer layer-lower oxide electrode 182, there was provided either a multilayer film formed with $(La_{0.85}Sr_{0.15})MnO_3$ (50 nm), $SrTiO_3$ (100 nm), and $(La_{0.95}Sr_{0.05})TiO_3$ (50 nm), or a multilayer film formed with $(Li_{0.001}Ni_{0.99})O$ (50 nm), $SrTiO_3$ (100 nm), and $(La_{0.95}Sr_{0.05})TiO_3$ (50 nm). Both of the multilayer films 183 had remarkable asymmetry as to electric properties, and exhibited characteristics like a diode.

Subsequently, to form a magnetoresistive element 184, a $La_{1.4}Ca_{1.6}Mn_2O_7$ thin film (20 nm) as a lower ferromagnetic layer, a $(Bi_{0.95}Pb_{0.05})_2(Sr_{0.75}Ca_{0.25})CaMn_2O_9$ thin film (2 nm), and a $(La_{0.7}Ca_{0.3})MnO_3$ thin film (20 nm) as an upper ferromagnetic layer were laminated thereon in the stated order. Further, $(La_{0.65}Sr_{0.35})RuO_3$ was deposited thereon to a thickness of 20 nm so as to form a thin film serving as an oxide electrode, and a lead electrode 185 was formed using Au. Here, $La_{1.4}Ca_{1.6}Mn_2O_7$ is expressed as $(La,Ca)_3Mn_2O_7$, and is an analogous compound having a structure in which $(La, Ca)MnO_3$ and $(La,Ca)_2MnO_4$ are cyclically laminated. Incidentally, $Al_2O_3$, $CaF_2$, and $SiO_2$ were used to form interlayer insulating films 186.

The lead electrode 185 was connected to an electrode that constitutes a bit line 188, and the buffer layer 182 was connected to an electrode that constitutes a sensing line 189. Current-voltage characteristics were examined as to a single piece of a magnetoresistive element of the coercive force difference type thus formed, and it was confirmed that the element exhibited remarkable asymmetry and excellent magnetoresistance effect characteristics.

Figure 10A:
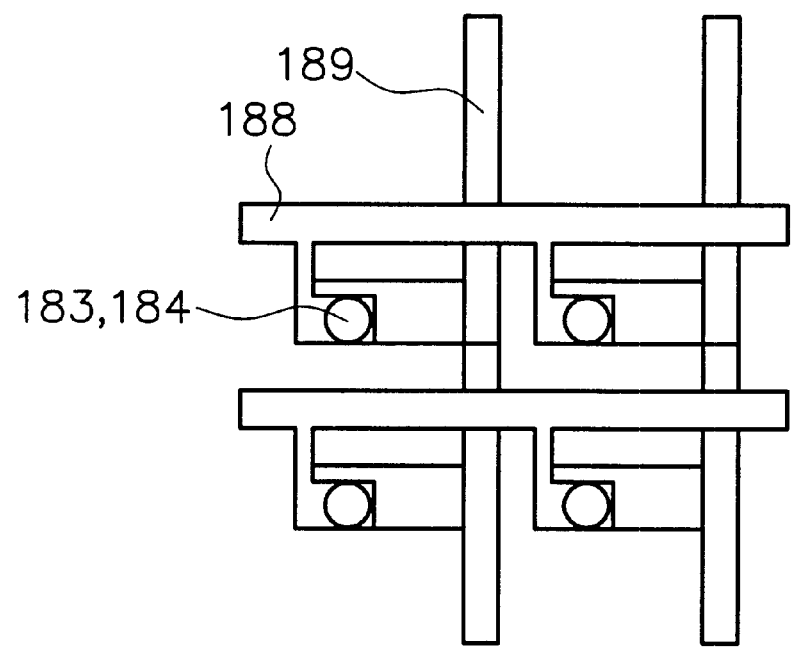
FIGS. 10A and 10B are plan views each showing a wire layout in a magnetic memory element that is formed utilizing magnetoresistive elements of the present invention.
Figure 10B:
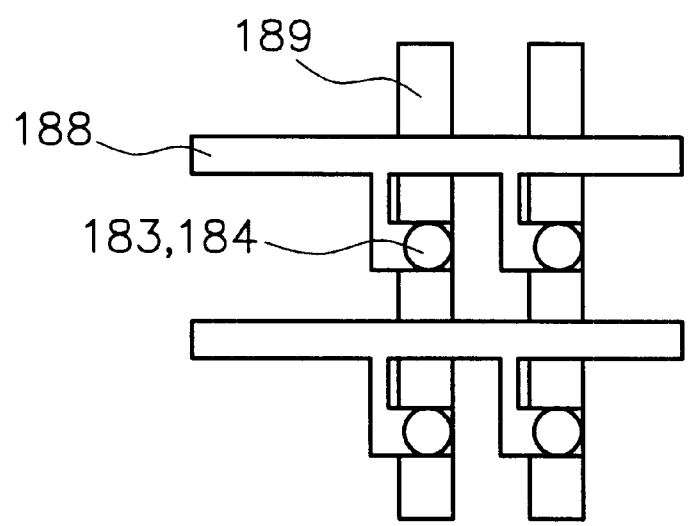

Magnetoresistive elements formed as above were arrayed in a matrix form as shown in FIG. 10A, with interlayer insulating films being provided to isolate each of the elements, and upper electrodes were provided in a direction crossing lower electrodes at right angles. The upper and lower electrodes were used as bit lines 188 and sense lines 189 of the MRAM, respectively. As illustrated in FIG. 10B, the magnetoresistive elements 184 may be formed on the lower electrodes (sense line 189), so that the sense lines also can be used as wires for generation of a magnetic field.

Furthermore, word lines 187 were provided so as to cross the sense lines at right angles. Thus, a basic structure of the MRAM was formed. Incidentally, AuCr or Cu was used to form conductive films used as sense lines, Au or Cu was used to form conductive films used as word lines, and $Al_2O_3$ was used for insulation between the memory elements and the word lines. Thus, a 256×256 matrix-form memory was configured.

Figure 11A:
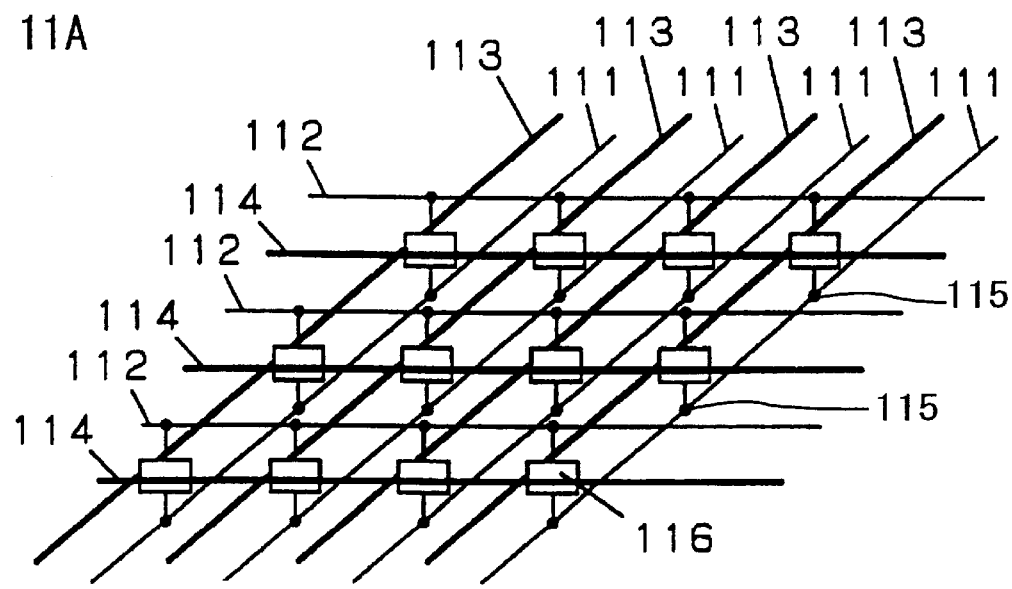
FIG. 11A is a view illustrating a wire layout in a magnetic memory element of the present invention.

The matrix-form memory was provided with sense lines 111, bit lines 112, and word lines 113 and 114 as illustrated in FIG. 11A. Magnetoresistive elements 116, each constituting a memory cell, were provided between the sense lines and the bit lines. Herein two word lines were used for each, in order to improve writing selectivity. Nodes of the lines are illustrated with dots 115, respectively, for convenience.

Figure 11B:
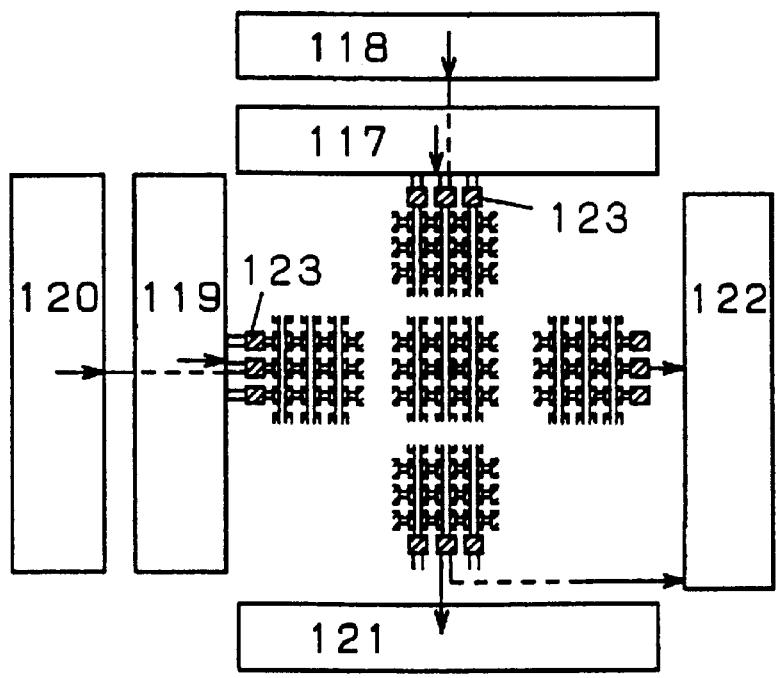
FIG. 11B is a view illustrating an example of a configuration of a magnetic memory device in which the magnetic memory elements are used.

As shown in FIG. 11B, the MRAM device was provided with switching sections (118 for the sense lines, 119 for the bit lines, 117 and 120 for word lines) for addressing, signal path transistor sections 123 that, in response to the addressing, determine availability of the address for writing or reading by turning on/off, a signal resistance detecting section 121, and a word-line-use signal detecting section 122, with which information recording and reproduction was carried out. The storing was carried out as follows: current pulses are sent through the word lines as row elements and column elements, and a magnetic field thereby generated causes a magnetization of a specific element to change.

An operation of the MRAM device thus formed, in a certain storing state, was checked in the follow manner: a memory element at a specific address is selected by a first addressing switch section, and a current pulse selected by a second addressing switch section that generates a magnetic field to affect only the foregoing selected memory element at the specific address so as to invert the magnetization direction of the ferromagnetic film thereof having the smaller coercive force is applied to the foregoing selected memory element through either the word line as the row element or the word line as the column element, while a resistance of the selected memory element is monitored using the sense line. Here, a change according to "0" or "1" as memory information stored in the other ferromagnetic layer having the greater coercive force was detected as a pulse by the signal resistance detecting section. Since the magnetization direction was maintained, that is, the memory state was preserved, in the ferromagnetic layer having the greater coercive force, it was confirmed that the operation was a non-destructive reading operation with respect to memory information. Thus, the basic operation of the MRAM device was confirmed. The use of the foregoing magnetic memory element allows a high-integration MRAM device to be obtained.

The magnetic recording element discussed in the description of the present embodiment is provided with a pair of ferromagnetic bodies sandwiching a layered-perovskite oxide that exhibits a magnetoresistive tunnel effect upon the application of a bias, and at least one non-magnetic conductive layer for generating an external magnetic field, electrically out of contact with the foregoing ferromagnetic bodies, wherein one of the ferromagnetic bodies is a free ferromagnetic layer, while the other is a pinned ferromagnetic layer.

The foregoing magnetic recording element operates through:

(1) the step of setting a 1-bit signal by storing as "0" or "1" a change of an approximately parallel magnetization state or an approximately anti-parallel magnetization state of the ferromagnetic layers, the approximately parallel or anti-parallel magnetization state of the ferromagnetic layers being obtained by setting magnetization directions thereof along the alignment directions of the ferromagnetic layers;

(2) the 1-bit signal writing step of applying a current pulse to the non-magnetic conductive layer so as to orient the magnetization directions of the ferromagnetic layers along the two alignment directions; and (3) the step of reading a change in the resistance that is produced due to a difference between the foregoing two magnetization states.

Eighth Embodiment

Film formation was carried out by sputtering so that a multilayer film as described below was formed in one vacuum chamber. The multilayer film was formed onto a substrate heated to approximately 600° C. to 800° C. First, $SrVO_3$ was deposited to 50 nm in thickness on a $SrTiO_3$ (100)-surface substrate, to form a layer to function both as a buffer layer and an oxide electrode layer. Thereon, $(Sr_{1-x}Ca_x)_2FeMO_6$ (x=0, 0.25, 0.5, 0.75, 1, and M=Mo, Re) was deposited, and further, $Bi_2Sr_2CaMn_2O_{9-\delta}$, as well as $La_{1.4}(Sr_{1-y}Ca_y)_{1.6}Mn_2O_7$ (y=0, 0.25, 0.5, 0.75, 1) as an oxide ferromagnetic layer were deposited to 3 nm and 20 nm, respectively, in the stated order. Further thereon, $Sr_2RuO_4$ was deposited so as to form an upper electrode. It was confirmed that these thin films were grown with the c axis being oriented perpendicularly to the substrate surface. $(Sr,Ca)_2FeMO_6$ used herein is a material composed of two kinds of perovskite materials having a perovskite structure of $AB(1)O_3\_AB(2)O_3$ that is called double perovskite. In this case, A=Sr,Ca, B(1)=Fe, and B(2)=Mo,Re. Further, $La_{1.4}Sr_{1.6}Mn_2O_7$ is a material composed of two perovskite analogous compounds expressed as $(La,Sr)_2MnO_{4\_}(La,Sr)MnO_3$. Subsequently, a photoresist was formed, which was patterned so as to have an aspect ratio of 1:2.5, and an element width of 0.2 μm to 10 μm. Then, etching was carried out with argon ions, so that a junction section was carved out. Thereafter, an insulating-separating layer was formed with a $CaF_2$ thin film, and a lead electrode made of gold was provided, whereby the element was finished. The outcome of measurement at approximately 20K proved that a MR characteristic was observed with any composition. Note that x in $(Sr_{1-x}Ca_x)_2FeMO_6$ preferably is less than 1, since $Ca_2FeMO_6$ has an electric conductivity in closer approximation to that of a semiconductor thereby having an excessively great resistance as a ferromagnetic electrode.

Next, likewise, film formation was carried out by sputtering so that a multilayer film as described below was formed in one vacuum chamber. The multilayer film was formed onto a substrate heated to approximately 600° C. to 800° C. $SrVO_3$ was deposited to 50 nm in thickness on a $SrTiO_3$(100)-surface substrate, to form a layer to function both as a buffer layer and an oxide electrode layer. Thereon, $(Sr_{1-x}Ca_x)_2FeMO_6$ (x=0, 0.25, 0.5, 0.75, and M=Mo, Re) was deposited to 20 nm in thickness, and further, $Bi_2Sr_2CaMn_2O_{9-\delta}$, as well as $(Sr_{1-x}Ca_x)_2FeMO_6$ (x=0, 0.25, 0.5, 0.75, and M=Mo, Re) as an oxide ferromagnetic layer were deposited to 3 nm and 20 nm, respectively, in the stated order. Further thereon, $Sr_2RuO_4$ was deposited so as to form an upper electrode. It was confirmed that these thin films were grown with the c axis being oriented perpendicularly to the substrate surface. Subsequently, a photoresist was formed, which was patterned so as to have an aspect ratio of 1:2.5, and an element width of 0.2 μm to 10 μm. Then, etching was carried out with argon ions, so that a junction section was carved out. Thereafter, an insulating-separating layer was formed with a $CaF_2$ thin film, and a lead electrode made of gold was provided, whereby the element was finished. The outcome of measurement at room temperature proved that a MR characteristic was observed with any composition, therefore it was confirmed that the magnetoresistive element of the present invention was effective.

As described above, according to the present invention, used is an insulating layer involved in a layer perovskite oxide that is capable of functioning not only at a low temperature but also at room temperature in response to a low magnetic field, hence, it is possible to provide an element having a magnetoresistive tunnel junction characteristic with high sensitivity. The present invention is to provide basic element components of magnetic devices, and to make a great contribution in the development of magnetic devices.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A magnetoresistive element comprising:
    a layered-perovskite oxide having a composition expressed by a formula $L_2(A_{1-z}R_z)_2A_{n-1}M_nO_{3n-3+x}$ and including a $(L-O)_2$ layer in its crystalline structure;
    a pair of ferromagnetic bodies formed in contact with the layered-perovskite oxide so as to sandwich the oxide, at least one of the pair of ferromagnetic bodies being made of a perovskite oxide; and
    an oxide electrode provided in contact with the ferromagnetic body made of a perovskite oxide,
    where:
        A represents at least one alkaline earth element selected from the group consisting of Ca, Sr, and Ba;
        L represents at least one element selected from the group consisting of Bi, Tl, and Pb;
        M represents at least one element selected from the group consisting of Ti, V, Cu, Ru, Ni, Mn, Co, Fe, and Cr;
        R represents a rare earth element;
        n is 1, 2, or 3; and
        x and z are numerical values satisfying $-1 \leq x \leq 1$, and $0 \leq z \leq 1$, respectively.

2. The magnetoresistive element according to claim 1, wherein the ferromagnetic body made of a perovskite oxide has a composition expressed by a formula $((R_{1-p}L_p)_{1-y}A_y)_m)MO_{m-2-d}$,
    where:
        A, L, M, and R represent the same elements as those set forth in claim 1, respectively;
        m is 1 or 2; and
        d, p, and y are numerical values satisfying $0 \leq d \leq 1$, $0 \leq p \leq 1$, and $0 \leq y \leq 1$, respectively.

3. The magnetoresistive element according to claim 2, wherein p is a numerical value satisfying $0 < p \leq 1$.

4. The magnetoresistive element according to claim 2, wherein y and z satisfy $0.05 \leq y \leq 0.55$ and $0.05 \leq 1-z \leq 0.55$, respectively.

5. The magnetoresistive element according to claim 2, wherein the relationship $0.8(1-z) \leq y \leq 1.2(1-z)$ is satisfied.

6. The magnetoresistive element according to claim 1, wherein the ferromagnetic body made of a perovskite oxide and the layered-perovskite oxide layer contain the same element for the element L.

7. The magnetoresistive element according to claim 1, wherein the oxide electrode is made of a perovskite oxide.

8. The magnetoresistive element according to claim 7, wherein the oxide electrode made of a perovskite oxide has a composition expressed by a formula $(A_{1-v}R_v)_j(X_{1-r}T_r)O_{j+2-q}$,
    where:
        A and R represent the same elements as those set forth in claim 1, respectively;
        T represents the same element as the element M contained in the ferromagnetic body in contact with the oxide electrode;
        X represents at least one element selected from the group consisting of Ti, V, Cu, Ru, Ni, and Cr, except the element T
        j is 1 or 2; and
        q, r, and v are numerical values satisfying $0 \leq q \leq 1$, $0 \leq r \leq 1$, and $0 \leq v \leq 1$, respectively.

9. The magnetoresistive element according to claim 8, wherein r satisfies $0 < r \leq 1$.

10. The magnetoresistive element according to claim 1, wherein one of the pair of ferromagnetic bodies is made of a perovskite oxide, and the other is made of a metallic ferromagnetic material.

11. The magnetoresistive element according to claim 10, wherein the metallic ferromagnetic material contains a ferromagnetic material expressed by a formula $Ni_xCo_yFe_z$, where x, y, and z are numerical values satisfying $x+y+z=1$ and one of the following (i) and (ii):
    (i) $0.6 \leq x \leq 0.9$, $0 \leq y \leq 0.4$, and $0 \leq z \leq 0.3$
    (ii) $0 \leq x \leq 0.4$, $0.2 \leq y \leq 0.95$, and $0 \leq z \leq 0.5$.

12. The magnetoresistive element according to claim 10, wherein the metallic ferromagnetic material contains a ZMnSb alloy ferromagnetic material, where Z represents at least one element selected from the group consisting of Ni, Pt, and Pd.

13. The magnetoresistive element according to claim 1, wherein the ferromagnetic bodies in the pair have different coercive forces.

14. The magnetoresistive element according to claim 1, wherein the ferromagnetic bodies in the pair have different thicknesses.

15. The magnetoresistive element according to claim 1, wherein the rare earth element R is at least one selected from the group consisting of La, Pr, Nd, and Sm.

16. A magnetic memory element comprising the magnetoresistive element according to claim 1.

17. A magnetic head comprising the magnetoresistive element according to claim 1.

18. A magnetoresistive element comprising:
    a layered-perovskite oxide having a composition expressed by a formula $L_2(A_{1-z}R_z)_2A_{n-1}M_nO_{3n+3+x}$ and including a $(L-O)_2$ layer in its crystalline structure; and
    a pair of ferromagnetic bodies formed in contact with the layered-perovskite oxide so as to sandwich the oxide, one of the pair of ferromagnetic bodies being made of a perovskite oxide, the other being made of a metallic ferromagnetic material,
    where:
        A represents at least one alkaline earth element selected from the group consisting of Ca, Sr, and Ba;
        L represents at least one element selected from the group consisting of Bi, Tl, and Pb;
        M represents at least one element selected from the group consisting of Ti, V, Cu, Ru, Ni, Mn, Co, Fe, and Cr;
        R represents a rare earth element;
        n is 1, 2, or 3; and
        x and z are numerical values satisfying $-1 \leq x \leq 1$, and $0 \leq z < 1$, respectively.

19. The magnetoresistive element according to claim 18, wherein the metallic ferromagnetic material contains a ferromagnetic material expressed by a formula $Ni_xCo_yFe_2$, where x, y, and z are numerical values satisfying x+y+z=1 and one of the following (i) and (ii):

(i) $0.6 \leq x \leq 0.9$, $0 \leq y \leq 0.4$, and $0 \leq z \leq 0.3$ (ii) $0 \leq x \leq 0.4$, $0.2 \leq y \leq 0.95$, and $0 \leq z \leq 0.5$.

20. The magnetoresistive element according to claim 18, wherein the metallic ferromagnetic material contains a ZMnSb alloy ferromagnetic material, where Z represents at least one element selected from the group consisting of Ni, Pt, and Pd.

21. The magnetoresistive element according to claim 18, further comprising an oxide electrode provided in contact with the ferromagnetic body made of a perovskite oxide.

22. The magnetoresistive element according to claim 21, wherein the oxide electrode is made of a perovskite oxide.

23. The magnetoresistive element according to claim 18, further comprising an antiferromagnetic body formed in contact with one of the pair of ferromagnetic bodies.

24. The magnetoresistive element according to claim 23, wherein both the antiferromagnetic body and the ferromagnetic body in contact with the antiferromagnetic body are made of a perovskite oxide, respectively.

25. A magnetic memory element comprising the magnetoresistive element according to claim 18.

26. A magnetic head comprising the magnetoresistive element according to claim 18.

27. A magnetoresistive element comprising:

a layered-perovskite oxide having a composition expressed by a formula $L_2(A_{1-z}R_z)_2A_{n-1}M_nO_{3n+3+x}$ and including a $(L-O)_2$ layer in its crystalline structure;

a pair of ferromagnetic bodies formed in contact with the layered-perovskite oxide so as to sandwich the oxide; and an antiferromagnetic body formed in contact with one of the pair of ferromagnetic bodies, where:

A represents at least one alkaline earth element selected from the group consisting of Ca, Sr, and Ba;

L represents at least one element selected from the group consisting of Bi, Ti, and Pb;

M represents at least one element selected from the group consisting of Ti, V, Cu, Ru, Ni, Mn, Co, Fe, and Cr;

R represents a rare earth element;

n is 1, 2, or 3; and x and z are numerical values satisfying $-1 \leq x \leq 1$, and $0 \leq z < 1$, respectively.

28. The magnetoresistive element according to claim 27, wherein both the antiferromagnetic body and the ferromagnetic body in contact with the antiferromagnetic body are made of a perovskite oxide, respectively.

29. A magnetic memory element comprising the magnetoresistive element according to claim 27.

30. A magnetic head comprising the magnetoresistive element according to claim 27.

* * * * *

UNITED STATES PATENT AND TRADEMARK OFFICE
CERTIFICATE OF CORRECTION

PATENT NO. : 6,594,120 B2
DATED : July 15, 2003
INVENTOR(S) : Odagawa et al.

It is certified that error appears in the above-identified patent and that said Letters Patent is hereby corrected as shown below:

<u>Column 15,</u>
Line 20, "formula $L_2(A_{1-z}R_z)_2A_{n-1}M_nO_{3n-3+x}$" should read
-- formula $L_2(A_{1-z}R_z)_2A_{n-1}M_nO_{3n+3+x}$ --
Line 44, "$A_y)_m)MO_{m-2-d}$" should read -- $A_y)_mMO_{m+2-d}$ --

Signed and Sealed this

Thirtieth Day of March, 2004

JON W. DUDAS
*Acting Director of the United States Patent and Trademark Office*